(12) United States Patent
Chae et al.

(10) Patent No.: US 11,967,381 B2
(45) Date of Patent: Apr. 23, 2024

(54) SEMICONDUCTOR MEMORY DEVICE

(71) Applicant: SK hynix Inc., Icheon-si (KR)

(72) Inventors: Seung Wan Chae, Icheon-si (KR); Young Ki Kim, Icheon-si (KR); Jong Il Lee, Icheon-si (KR); Eun Woo Jo, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 226 days.

(21) Appl. No.: 17/495,520

(22) Filed: Oct. 6, 2021

(65) Prior Publication Data

US 2022/0319604 A1 Oct. 6, 2022

(30) Foreign Application Priority Data

Apr. 1, 2021 (KR) .................. 10-2021-0042775

(51) Int. Cl.
*G11C 16/08* (2006.01)
*G11C 5/06* (2006.01)
*G11C 16/24* (2006.01)
*G11C 16/26* (2006.01)

(52) U.S. Cl.
CPC .......... *G11C 16/08* (2013.01); *G11C 5/06* (2013.01); *G11C 16/24* (2013.01); *G11C 16/26* (2013.01)

(58) Field of Classification Search
CPC .......... G11C 16/08; G11C 5/06; G11C 16/24; G11C 16/26; G11C 5/147; G11C 16/16; G11C 16/30; G11C 5/025; G11C 16/10; G11C 16/0483

USPC ................................... 365/230.06
See application file for complete search history.

(56) References Cited

U.S. PATENT DOCUMENTS

2015/0325303 A1* 11/2015 Hashimoto ........... G11C 7/14
365/185.11
2022/0115393 A1* 4/2022 Yu .................. H10B 43/10

FOREIGN PATENT DOCUMENTS

KR 1020150087991 A 7/2015
KR 1020160112780 A 9/2016

* cited by examiner

*Primary Examiner* — Huan Hoang
(74) *Attorney, Agent, or Firm* — WILLIAM PARK & ASSOCIATES LTD.

(57) ABSTRACT

A semiconductor memory device includes a memory cell array, a row decoder, a plurality of page buffers, and a voltage switching circuit. The memory cell array includes a plurality of memory cells. The row decoder is connected to the memory cell array through word lines. The plurality of page buffers are connected to the memory cell array through bit lines. The voltage switching circuit decodes an operation voltage and transmits the decoded operation voltage to the row decoder. The plurality of page buffers are formed in a first under cell region among first and second under cell regions, the first and second under cell regions being adjacent to each other in a first direction under the memory cell array. At least a portion of the voltage switching circuit is formed in an under slim region that is adjacent to the first under cell region and the second under cell region in a second direction.

12 Claims, 10 Drawing Sheets

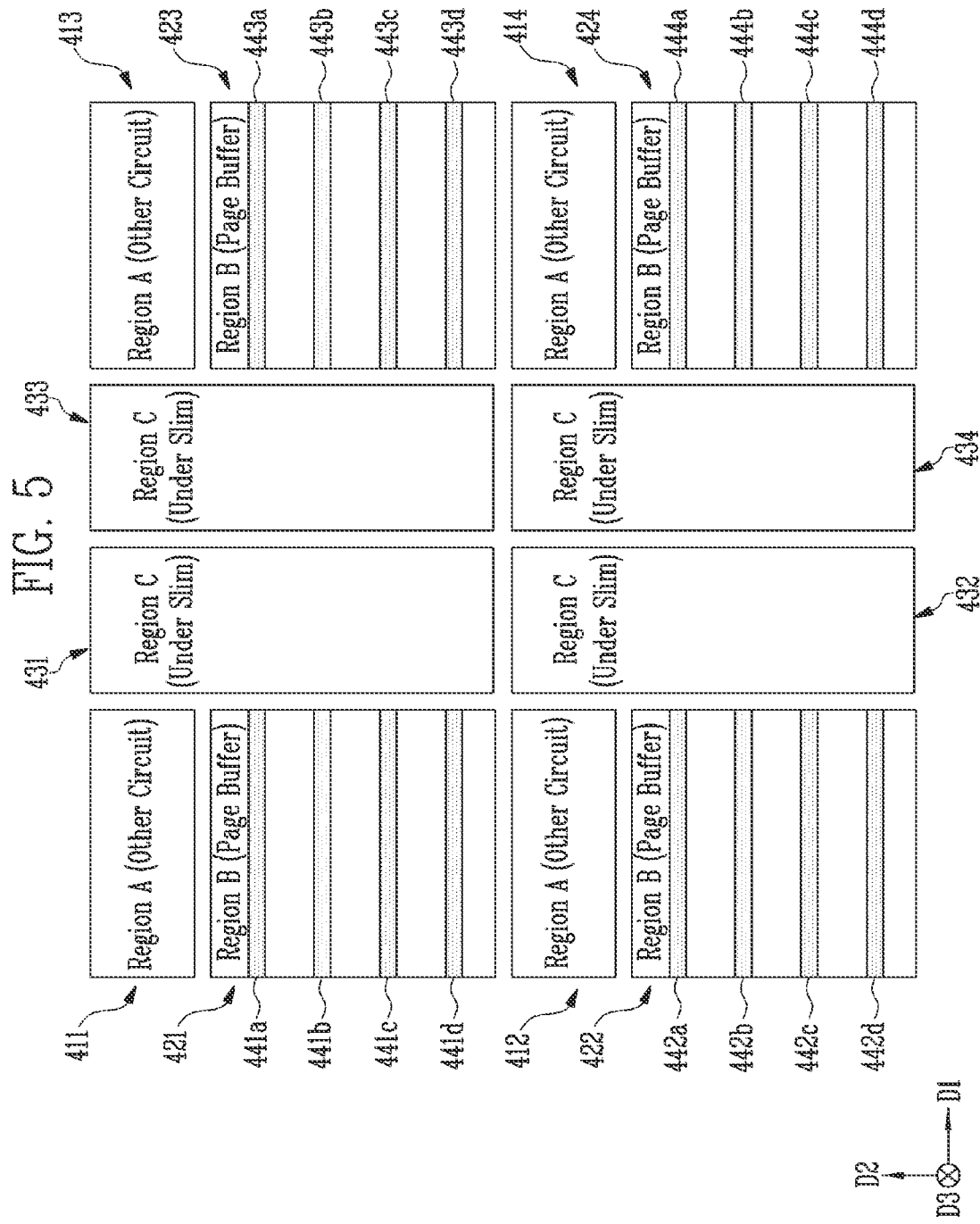

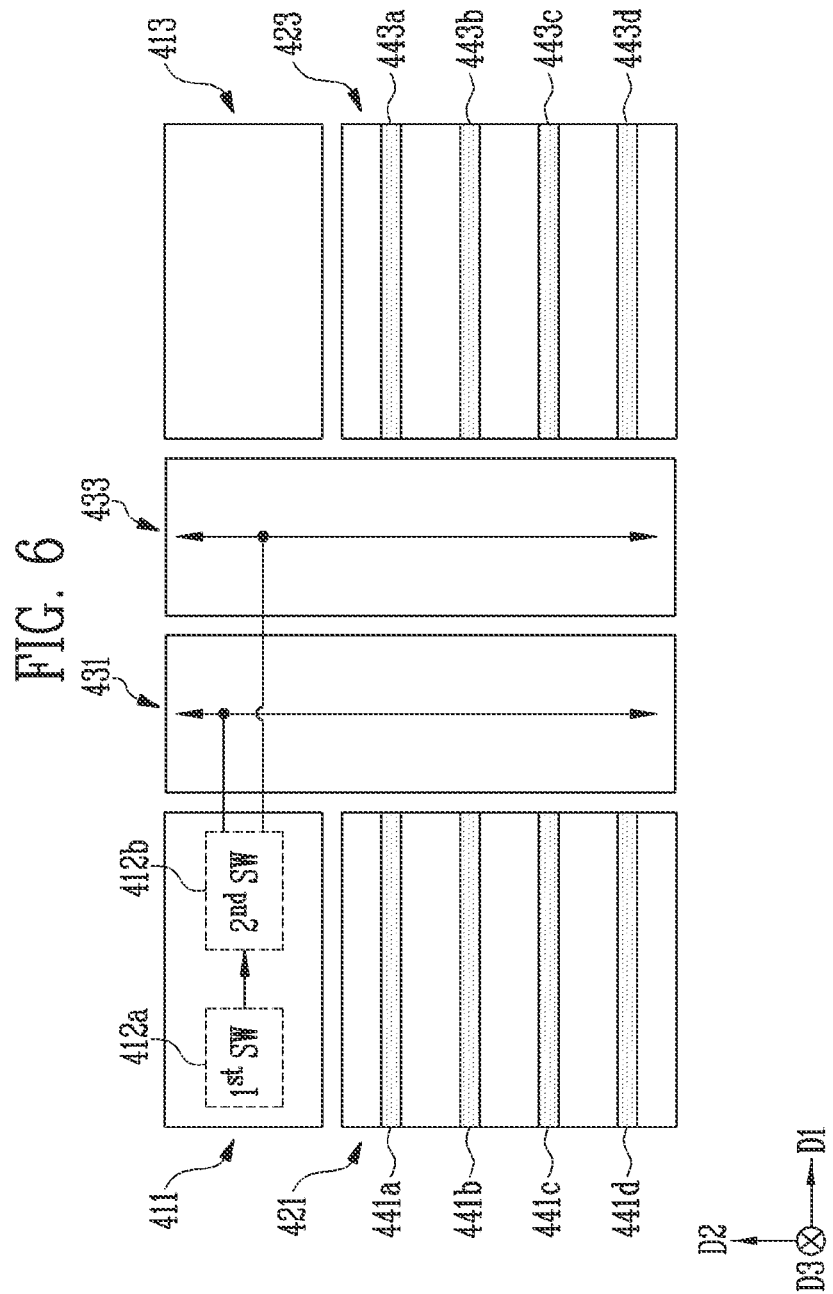

SEMICONDUCTOR MEMORY DEVICE

CROSS-REFERENCE TO RELATED APPLICATION

The present application claims priority under 35 U.S.C. § 119(a) to Korean patent application number 10-2021-0042775 filed on Apr. 1, 2021, in the Korean Intellectual Property Office, the entire disclosure of which is incorporated by reference herein.

BACKGROUND

1. Technical Field

The present disclosure relates to an electronic device, and more particularly, to a semiconductor memory device.

2. Related Art

A semiconductor memory device may be formed in a two-dimensional structure in which strings are horizontally arranged on a semiconductor substrate, or may be formed in a three-dimensional structure in which the strings are vertically stacked on the semiconductor substrate. A three-dimensional semiconductor memory device is a memory device designed to resolve a limit of an integration degree of a two-dimensional semiconductor memory device, and may include a plurality of memory cells that are vertically stacked on a semiconductor substrate.

SUMMARY

A semiconductor memory device includes a memory cell array, a row decoder, a plurality of page buffers, and a voltage switching circuit. The memory cell array includes a plurality of memory cells. The row decoder is connected to the memory cell array through word lines. The plurality of page buffers are connected to the memory cell array through bit lines. The voltage switching circuit decodes an operation voltage and transmits the decoded operation voltage to the row decoder. The plurality of page buffers are formed in a first under cell region among first and second under cell regions, the first and second under cell regions being adjacent to each other in a first direction under the memory cell array. At least a portion of the voltage switching circuit is formed in an under slim region that is adjacent to the first under cell region and the second under cell region in a second direction.

BRIEF DESCRIPTION OF THE DRAWINGS

FIG. 5 is a diagram illustrating a logic circuit LC region that is divided into a plurality of regions including region A, region B, and region C.

FIG. 6 is a diagram illustrating an embodiment in which a first switch circuit and a second switch circuit are implemented in region A.

DETAILED DESCRIPTION

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and should not be construed as being limited to the embodiments described in the present specification or application.

An embodiment of the present disclosure provides a semiconductor memory device of a reduced size.

Figure 1:
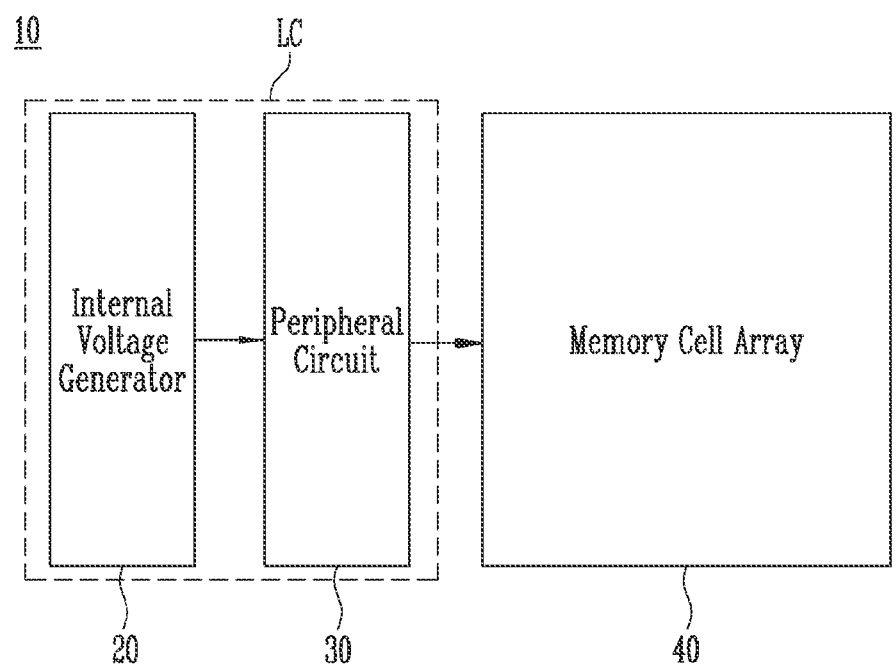
FIGS. 1 and 2 are block diagrams illustrating a semiconductor memory device according to an embodiment.
Figure 2:
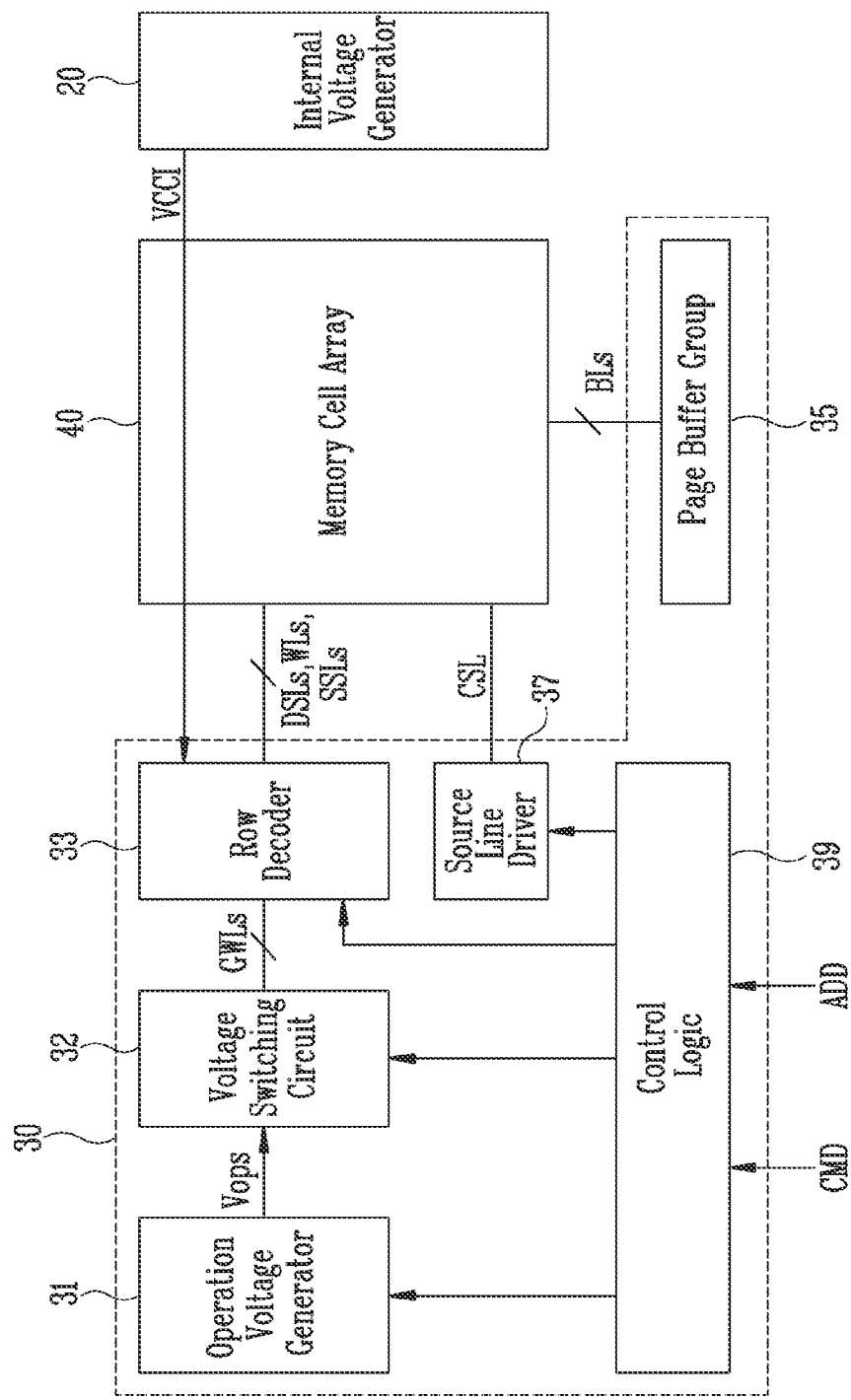

FIGS. 1 and 2 are block diagrams illustrating a semiconductor memory device 10 according to an embodiment.

FIG. 1 is a block diagram schematically illustrating the semiconductor memory device 10.

Referring to FIG. 1, the semiconductor memory device 10 includes a logic circuit LC and a memory cell array 40. The logic circuit LC may include an internal voltage generator 20 and a peripheral circuit 30.

The internal voltage generator 20 may be configured to receive an external voltage and generate various internal voltages. As an embodiment, the internal voltages may include an internal ground voltage and an internal power voltage.

The peripheral circuit 30 may be configured to perform a program operation for storing data in the memory cell array 40, a read operation for outputting data that is stored in the memory cell array 40, and an erase operation for erasing data that is stored in the memory cell array 40. The internal voltages that are required to activate the peripheral circuit 30 may be generated from the internal voltage generator 20 and may be supplied to the peripheral circuit 30.

FIG. 2 is a block diagram illustrating an embodiment of the peripheral circuit 30 shown in FIG.

Referring to FIG. 2, the peripheral circuit 30 may include a control logic 39, an operation voltage generator 31, a voltage switching circuit 32, a row decoder 33, a source line driver 37, and a page buffer group 35.

The memory cell array 40 may include a plurality of memory blocks. Each of the memory blocks may be connected to one or more drain select lines DSLs, a plurality of word lines WLs, one or more source select lines SSLs, a plurality of bit lines BLs, and at least one common source line CSL.

The control logic 39 may control the peripheral circuit 30 in response to a command CMD and an address ADD.

The operation voltage generator 31 may generate various operation voltages VOPs that are used for the program operation, the read operation, and the erase operation in response to the control logic 39. The operation voltages VOPs may include a program voltage, a verify voltage, a pass voltage, a select line voltage, and the like. The operation voltages VOPs may be transmitted to the voltage switching circuit 32.

The voltage switching circuit 32 may transmit the received operation voltages VOPs to global word lines GWLs. More specifically, the voltage switching circuit 32 may transmit an operation voltage that is required according to an operation of the semiconductor memory device 10 to appropriate global word lines GWLs.

The row decoder 33 may select a memory block in response to the control of the control logic 39. The row decoder 33 may be configured to apply the operation voltages VOPs to the drain select lines DSLs, the word lines WLs, and the source select lines SSLs that are connected to the selected memory block. More specifically, the row decode 33 may decode the operation voltages VOPs that are transmitted through the global word lines GWLs and may transmit the decoded operation voltages to the word lines WLs.

The source line driver 37 may be connected to the memory cell array 40 through the common source line CSL. The source line driver 37 may be configured to perform a discharge operation of the common source line CSL in response to the control logic 39. The source line driver 37 may apply a pre-erase voltage and an erase voltage to the common source line CSL during the erase operation in response to the control of the control logic 39.

The page buffer group 35 may be connected to the memory cell array 40 through the bit lines BLs. The page buffer group 35 may temporarily store data, which is to be programmed, received from an input/output circuit (not shown) during the program operation in response to the control of the control logic 39. The page buffer group 35 may sense a voltage or a current of the bit lines BLs during the read operation or the verify operation in response to the control logic 39. The page buffer group 35 may selectively float the bit lines BLs in response to the control of the control logic 39.

The internal voltages that are output from the internal voltage generator 20 may be supplied to the peripheral circuit 30. As an embodiment, an internal power voltage VCCI may be output from the internal voltage generator 20. The internal power voltage VCCI may be supplied to the peripheral circuit 30 via a wire that overlaps the memory cell array 40.

Figure 3:
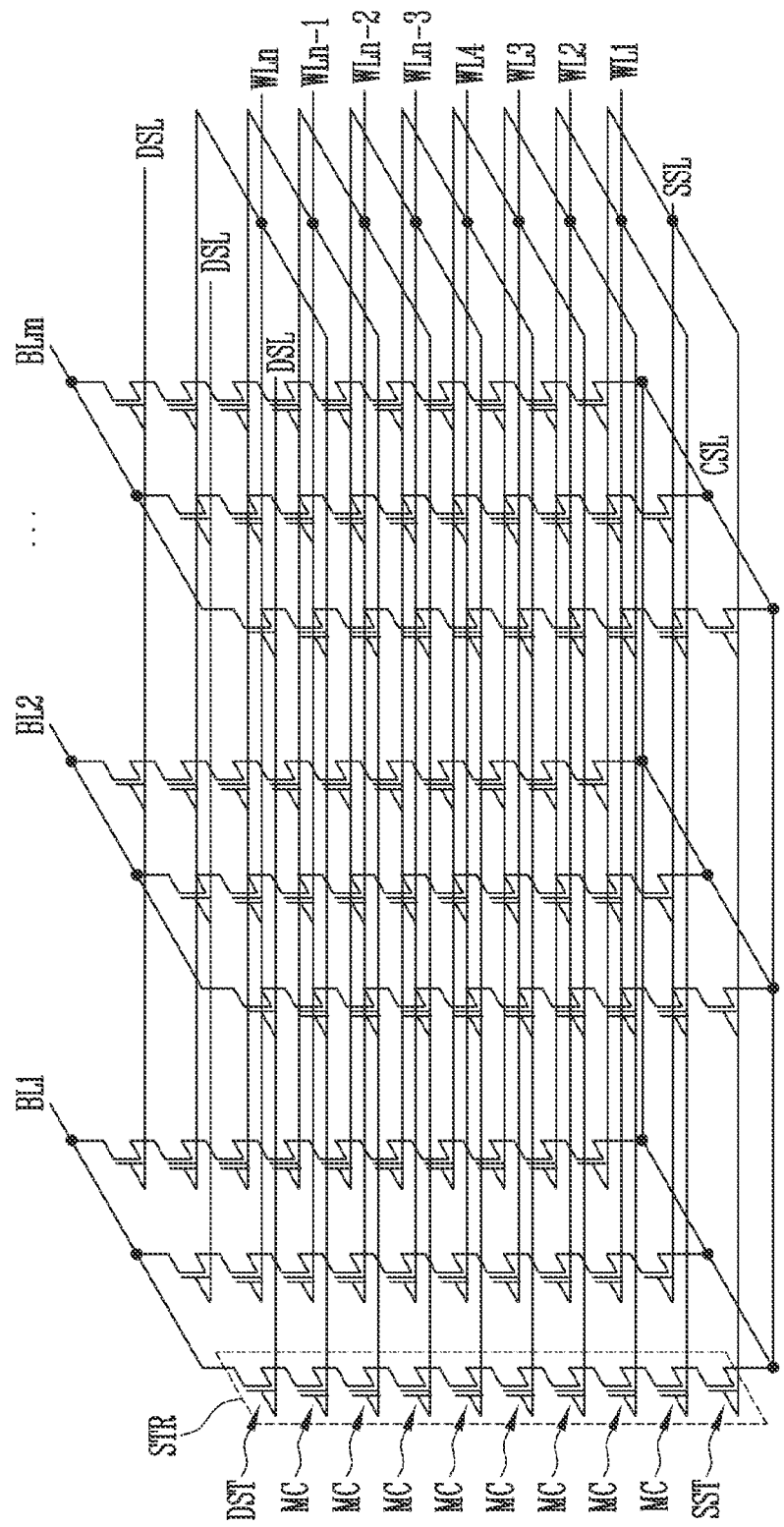
FIG. 3 is an equivalent circuit diagram illustrating a memory block according to an embodiment.

FIG. 3 is an equivalent circuit diagram illustrating a memory block according to an embodiment.

Referring to FIG. 3, the memory block may include a plurality of memory cell strings STR that are commonly connected to the common source line CSL. The memory cell strings STR may be connected to the plurality of bit lines BL1 to BLm. The memory cell strings STR may be divided into a plurality of column groups that are respectively connected to the bit lines BL1 to BLm. The memory cell strings STR of each column group may be connected to a corresponding bit line, in parallel.

Each of the memory cell strings STR may include one or more drain select transistors, a plurality of memory cells, and one or more source select transistors that are disposed between a corresponding bit line and the common source line CSL. The gates of each of the drain select transistors may be connected to a corresponding drain select line, the gates of each of the memory cells may be connected to a corresponding word line, and the gates of each of the source select transistors may be connected to a corresponding source select line.

As an embodiment, each of the memory cell strings STR may be connected to the drain select line DSL, the plurality of word lines WL1 to WLn, and the source select line SSL. In this case, each of the memory cell strings STR may include a drain select transistor DST that is connected to the drain select line DSL, memory cells MC that are connected to the word lines WL1 to WLn, and a source select transistor SST that is connected to the source select line SSL.

The plurality of memory cells MC may be connected in series. The drain select transistor DST may be disposed between the plurality of memory cells MC and a bit line, corresponding thereto. The drain select transistor DST may include a junction region that is connected to a corresponding bit line. The source select transistor SST may be disposed between the plurality of memory cells MC and the common source line CSL. The source select transistor SST may include a junction region that is connected to the common source line CSL.

The structure of each of the memory cell strings STR is not limited to the embodiment that is shown in FIG. 3. As an embodiment, each memory cell string STR may include two or more drain select transistors, connected in series, disposed between the plurality of memory cells MC that are connected in series and a corresponding bit line. In this case, two or more drain select lines may be disposed between the bit lines BL1 to BLm and the word lines WL1 to WLn. As an embodiment, each memory cell string STR may include two or more source select transistors, connected in series, disposed between the plurality of memory cells MC that are connected in series and the common source line CSL. In this case, two or more source select lines may be disposed between the common source line CSL and the word lines WL1 to WLn.

As an embodiment, at least one of the word lines WL1 to WLn may be used as a dummy word line. For example, at least one of the word line WL1 that is adjacent to the source select line SSL or the word line WLn that is adjacent to the drain select line DSL may be used as the dummy word line.

The erase operation of the semiconductor memory device may include a hot hole formation period and an erase period.

Referring to FIGS. 2 and 3, during the hot hole formation period of the erase operation, the row decoder 33 may control the word lines WL1 to WLn of the selected memory block to be at a floating state, and the page buffer group 35 may control the bit lines BL1 to BLm of the selected memory block to be at a floating state.

During the hot hole formation period of the erase operation, the operation voltage generator 31 may apply the pre-erase voltage for generating a gate induced drain leakage (GIDL) current to the common source line CSL. At this time, when the voltage level of the source select line SSL is low, the GIDL current may be generated between the junction region of the source select line SSL and the source select transistor SST. As an embodiment, during the hot hole formation period of the erase operation, the row decoder 33 may control the source select line SSL to be at a ground voltage level.

When the GIDL current is generated, hot holes may be generated. The generated hot holes may be injected into a channel region of the memory cell string STR, and the GIDL current may be generated in the channel region. Accordingly, the channel voltage of the memory cell string STR may increase.

Subsequently, during the erase period of the erase operation, the operation voltage generator 31 may apply the erase voltage that is higher than the pre-erase voltage to the common source line CSL. As a result, the channel voltage of the memory cell string STR may further increase.

During the erase period of the erase operation, the row decoder 33 may control the source select line SSL to be at a floating state and may control the word lines WL1 to WLn to be at the ground voltage level. Accordingly, data that is stored in the memory cells MC may be erased by a voltage difference between the channel region of the memory cell string STR with an increased potential level and the word lines WL1 to WLn with the ground voltage level.

The erase operation may be ended by controlling the source select line SSL to be at the ground voltage level through the row decoder 33 to turn off the source select line SSL.

As an embodiment, in order to improve the efficiency of the above-described GIDL erase operation, during the erase operation, the voltage that is applied to the common source line CSL may be applied to the bit lines BL1 to BLm, and the voltage that is applied to the source select line SSL may be applied to the drain select line DSL. Accordingly, during the erase operation, the GIDL current may be generated between the junction region of the drain select line DSL and the drain select transistor DST, thereby improving erase efficiency.

As an embodiment, the voltage of the bit lines BL1 to BLm may be increased to the erase voltage through capacitive coupling, by applying a high voltage to a conductive layer that is positioned on the bit lines BL1 to BLm. In this case, the erase efficiency may be unproved even though transistors for directly applying the high voltage to the bit lines BL1 to BLm are not separately provided to the page buffer group 35 that is shown in FIG. 2. Therefore, when the high voltage for erasure is applied to the bit lines BL1 to BLm by using the capacitive coupling, it is advantageous for high integration of the semiconductor memory device.

Figure 4:
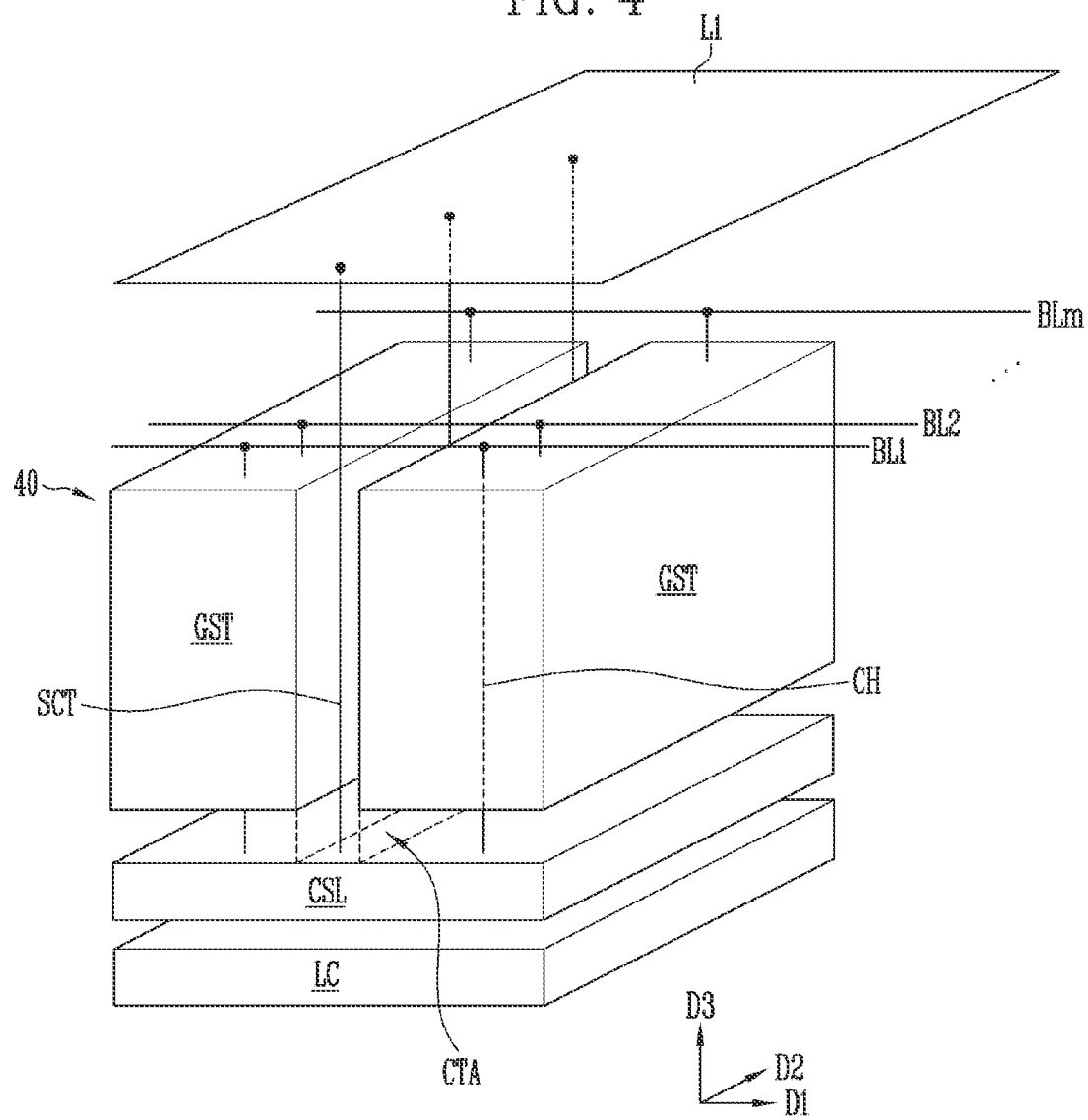
FIG. 4 is a diagram illustrating a conductive layer that is positioned on a bit line of a memory cell array.

FIG. 4 is a diagram illustrating a conductive layer that is positioned on a bit line of a memory cell array.

Referring to FIG. 4, the memory cell array 40 may be disposed between the common source line CSL and the bit lines BL1 to BLm. The memory cell array 40 may include gate stacks GST and channel structures CH that pass through the gate stacks GST, respectively. The hit lines BL1 to BLm may extend in a first direction D1. Although not shown in FIG. 4, a plurality of word lines may extend in a second direction D2. Meanwhile, the channel structures CH may extend in a third direction D3.

The gate stacks GST may be spaced apart from each other. FIG. 4 shows two gate stacks GST that are spaced apart from each other with a conductive source contact structure SCT interposed between the two gate stacks GST. In addition to the structure shown in FIG. 4, the memory cell array 40 may include three or more gate stacks GST that are spaced apart from each other.

Each of the channel structures CH may include one end that is connected to the common source line CSL and another end that is connected to a corresponding bit line among the bit lines BL1 to BLm. Each of the channel structures CH and the common source line CSL may be directly connected. Alternatively, a lower channel structure or a contact structure for connecting the channel structures CH and the common source line CSL may be formed. Each of the channel structures CH and a bit line, corresponding thereto, may be directly connected. Alternatively, a contact structure for connecting the channel structures CH and a bit line, corresponding thereto, may be formed.

The channel structures CH may be arranged in a zigzag or matrix form in a gate stack corresponding thereto.

The common source line CSL may be formed on a substrate that includes the logic circuit LC. The common source line CSL nay include a contact region CIA that does not overlap the gate stacks GST. As an embodiment, the contact region CTA of the common source line CSL may be disposed between the adjacent gate stacks GST. The source contact structure SCT may extend toward an upper conductive layer L1 from the contact region CTA of the common source line CSL.

In an embodiment, as shown in FIG. 4, the upper conductive layer L1 may be used to connect the common source line CSL to the source line driver 37 that is shown in FIG. 2. Accordingly, a potential level of the common source line CSL may be discharged through the source line driver 37, shown in FIG. 2, via the upper conductive layer L1. In addition, during the erase operation, the erase voltage that is provided through the source line driver 37, shown in FIG. 2, may be transmitted to the common source line CSL via the upper conductive layer L1. However, an embodiment of the present disclosure is not limited thereto. The upper conductive layer L1, according to an embodiment of the present disclosure, might not be connected to the common source line CSL. In this case, the upper conductive layer L1 may be used for a purpose other than the purpose of connecting the common source line CSL to the source line driver 37 as shown in FIG. 2. For example, the upper conductive layer L1 may be used as wirings that connect the internal voltage generator 20 and the peripheral circuit 30, shown in FIG. 2, to each other.

Meanwhile, in FIG. 4, one upper conductive layer L1 is formed between the bit lines BL1 to BLm. However, the present disclosure is not limited thereto, and a plurality of upper conductive layers that are disposed in the first direction D1 or the second direction D2 may be formed. In addition, a plurality of upper conductive layers that are disposed in the third direction D3 may be formed.

The upper conductive layer L1 may include a low resistance metal. The upper conductive layer L1 may include a metal, such as copper or aluminum.

FIG. 5 is a diagram illustrating a logic circuit LC region that is divided into a plurality of regions including region A, region B, and region C.

Referring to FIG. 5, a cross-sectional view of the semiconductor memory device 10, according to a height of the logic circuit LC based on the third direction D3 of FIG. 4, is shown. In the semiconductor memory device 10, a region positioned at the height of the logic circuit LC may be divided into region A's 411, 412, 413, and 414, regions B's 421, 422, 423, and 424, and region C's 431, 432, 433, and 434.

Region A's 411, 412, 413, and 414 may be regions that are positioned under the gate stack GST of FIG. 4, that is, the memory blocks. Since the memory cells are positioned at an upper end of region A, region A may be included in an under cell region. Meanwhile, other circuits, except for the page buffer, among the components of the logic circuit LC may be formed in region A.

Region B's 421, 422, 423, and 424 may also be regions that are positioned under the memory blocks and may be included in the under cell region similarly to region A. On the other hand, differently from region A, region B may be a region in which the plurality of page buffers are formed. As shown in FIG. 5, region A and region B may be positioned to be adjacent to each other in the D2 direction. Each of region B's 421, 422, 423, and 424 may include a bit line connector region to connect the page buffers to the corresponding bit lines BL1 to BLm, respectively. For example, region B's 421 may include four bit line connector regions 441a to 441d, region B's 422 may include four bit line connector regions 442a to 442d, region B's 423 may include four bit line connector regions 443a to 443d, and region B's 424 may include four bit line connector regions 444a to 444d. However, this is exemplary, and each of region B's 421, 422, 423, and 424 may include various numbers of bit line connector regions.

Region C's 431, 432, 433, and 434 may be regions to which local word lines that are connected to respective memory cells are connected. That is, alternately stacked interlayer insulating patterns and local word lines WL may be patterned in a stepped structure, on an upper portion of region C. The region in which the local word lines WL are patterned in the stepped structure may be referred to as a slim region. Since region C is a region that is positioned under the slim region, region C may be referred to as an under slim region in the present specification. The row decoder 33 for connecting the local word lines to the global word lines may be formed in the under slim region 431. As shown in FIG. 5, region C may be positioned to be adjacent to each of region A and region B in the direction D1. The direction D1 and the direction D2 may form a substantially right angle.

FIG. 6 is a diagram illustrating an embodiment in which a first switch circuit ($1^{st}$ SW) and a second switch circuit ($2^{nd}$ SW) are implemented in region A. For convenience of description, among the regions 411, 412, 413, 414, 421, 422, 423, 424, 431, 432, 433, and 434 shown in FIG. 5, only the regions 411, 413, 421, 423, 431, and 433 are shown.

Referring to FIG. 6, a first switch circuit 412a and a second switch circuit 412b may be formed in region A's 411. The first switch circuit 412a and the second switch circuit 412b, shown in FIG. 6, may be included in the voltage switching circuit 32 shown in FIG. 2.

The first switch circuit 412a and the second switch circuit 412b may transmit the various operation voltages VOPs that are generated from the operation voltage generator 31 to the under slim region, that is, region C's 431 and 433 through the global word line. The operation voltages VOPs that are transmitted to region C may be transmitted to the local word line by a decoding operation of the row decoder 33. To this end, the row decoder 33 may include a plurality of pass transistors that are decoded by a block word line. In an embodiment, the plurality of pass transistors that are included in the row decoder 33 may be formed in region C's 431 and 433.

Referring to FIG. 6, one second switch circuit 412b may be formed in region A's 411. However, actually, a plurality of second switch circuits 412b may be formed in region A's 411. For example, the number of second switch circuit 412b that are formed may be equal to the number of global word lines GWLs. Therefore, as shown in FIG. 6, when both of the first switch circuit 412a and the second switch circuit 412b are formed in region A's 411, the area that is required by region A's increases. Accordingly, the area that is occupied by the semiconductor memory device 10 may be increased.

Figure 7A:
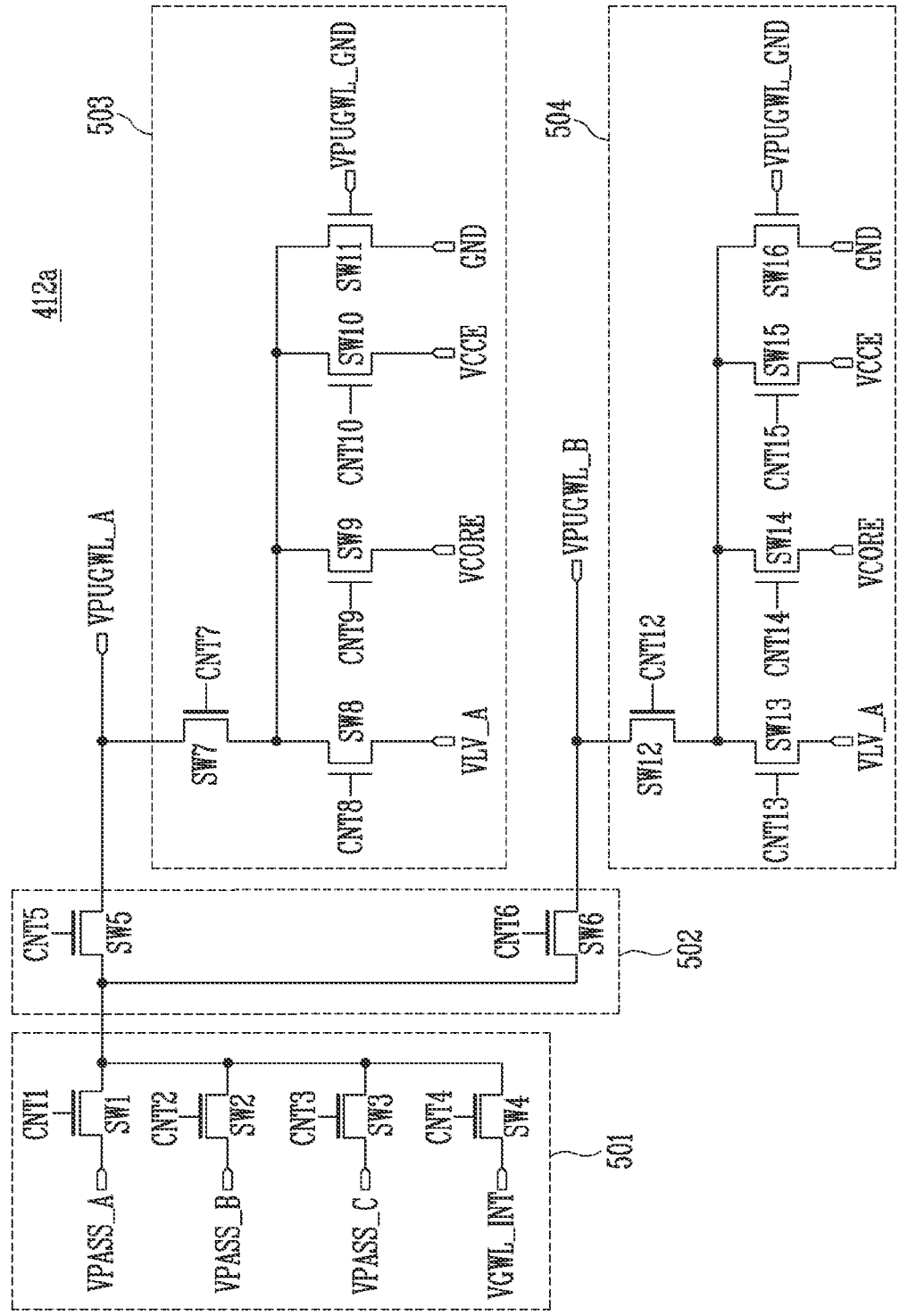
FIG. 7A is a circuit diagram illustrating an exemplary embodiment of the first switch circuit of FIG. 6.

FIG. 7A is a circuit diagram illustrating an exemplary embodiment of the first switch circuit 412a of FIG. 6.

Referring to FIG. 7A, the first switch circuit 412a includes a first circuit block 501, a second circuit block 502, a third circuit block 503, and a fourth circuit block 504. The first circuit block 501 includes first to fourth switches SW1 to SW4. The first to fourth switches SW1 to SW4 may be controlled by first to fourth control signals CNT1 to CNT4, respectively. The second circuit block 502 includes fifth and sixth switches SW5 and SW6. The fifth and sixth switches SW5 and SW6 may be controlled by the fifth and sixth control signals CNT5 and CNT6, respectively. The third circuit block 503 includes seventh to eleventh switches SW7 to SW11. The fourth circuit block 504 includes twelfth to sixteenth switches SW12 to SW16. The seventh to tenth switches SW7 to SW10 may be controlled by seventh to tenth control signals CNT7 to CNT10, respectively. The twelfth to fifteenth switches SW12 to SW15 may be controlled by twelfth to fifteenth control signals CNT12 to CNT15, respectively. Meanwhile, the eleventh and sixteenth switches SW11 and SW16 may be controlled by a non-selective ground control signal VPUGWL_GND.

Pass voltages VPASS_A to VPASS_C, an initialization voltage VGWL_INT, an internal low voltage VLV_A, an external power voltage VCCE, a core voltage VCORE, and ground voltage GND may be transmitted to the second switch circuit 412b by the first switch circuit 412a as shown in FIG. 7A. More specifically, the pass voltages VPASS_A to VPASS_C, the initialization voltage VGWL_INT, the internal low voltage VLV_A, the external power voltage VCCE, the core voltage VCORE, and the ground voltage GND may be transmitted to the second switch circuit 412b as VPUGWL_A voltages by the first circuit block 501, the second circuit block 502, and the third circuit block 503. Meanwhile, the internal low voltage VLV_A, the external power voltage VCCE, the core voltage VCORE, and the ground voltage GND may be transmitted to the second switch circuit 412b as VPUGWL_B voltage, by the first circuit block 501, the second circuit block 502, and the fourth circuit block 504. The VPUGWL_A voltage may be a voltage that is transmitted to a global word line of A group among unselected global word lines. The VPUGWL_B voltage may be a voltage transmitted to a global word line of B group among the unselected global word lines, FIG. 7B is a circuit diagram illustrating an exemplary embodiment of the second switch circuit 412b of FIG. 6.

Figure 7B:
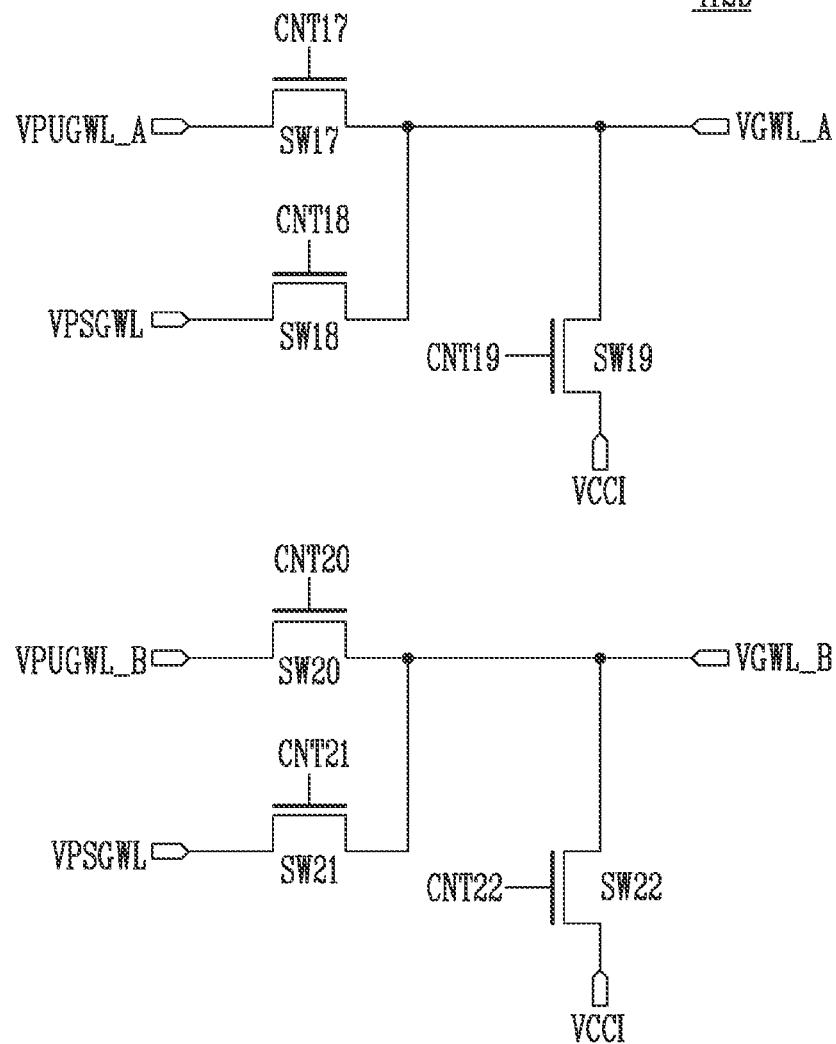
FIG. 7B is a circuit diagram illustrating an exemplary embodiment of the second switch circuit of FIG. 6.

Referring to FIG. 7B, the second switch circuit 412b includes seventeenth to twenty-second switches SW17 to SW22. The seventeenth to twenty-second switches SW17 to SW22 may be controlled by seventeenth to twenty-second control signals CNT17 to CNT22, respectively. According to the second switch circuit 412b, a select global word line voltage VPSGWL, the VPUGWL_A voltage, and an internal power voltage VCCI may be selectively transmitted as an A-th global word line voltage VGWL_A to any one of the global word lines of the A group. Meanwhile, according to the second switch circuit 412b, the select global word line voltage VPSGWL, the VPUGWL_B voltage, and the internal power voltage VCCI may be selectively transmitted as a B-th global word line voltage VGWL_B to any one of the global word lines of the B group.

As described above, the VPUGWL_A voltage may be a voltage that is transmitted to the global word line of the A group among unselected global word lines. The VPUGWL_B voltage may be a voltage that is transmitted to the global word line of the B group among the unselected global word lines. Meanwhile, the select global word line voltage VPSGWL may be a voltage that is transmitted to the selected global word line. The select global word line voltage VPSGWL may be transmitted from the operation voltage generator 31.

As described above, the number of second switch circuit 412b may be equal to the number of global word lines GWLs. As shown in FIG. 6, when both of the first switch circuit 412a and the second switch circuit 412b are formed in region A's 411, the area that is required for region A's increases. Accordingly, the area that is occupied by the semiconductor memory device 10 is increased.

In accordance with the semiconductor memory device, according to an embodiment of the present disclosure, at least some of the components of the voltage switching circuit 32 may be formed in region C, that is, the under slim 11 region, not in region A. In this case, the area of region A required to implement the voltage switching circuit 32 may be reduced. Therefore, a size of the semiconductor memory device 10 may be reduced.

Figure 8:
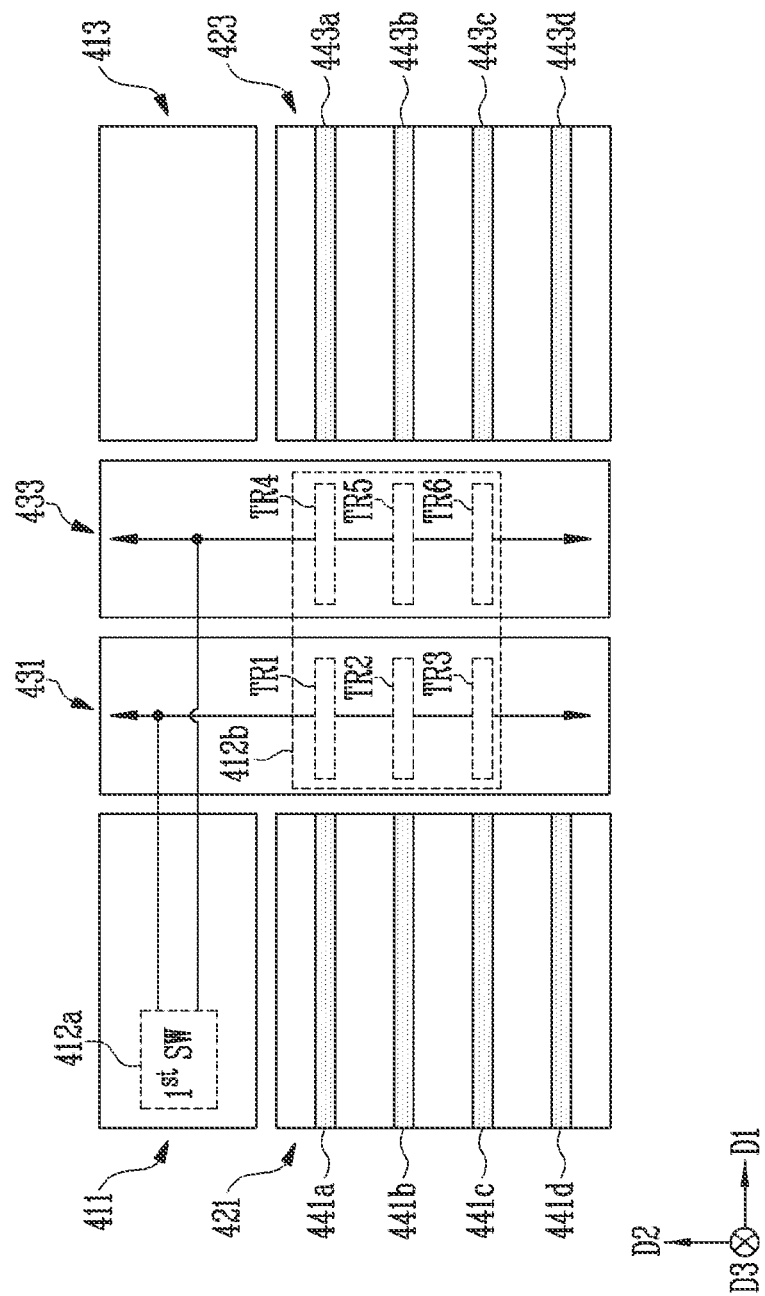
FIG. 8 is a diagram illustrating an embodiment in which a first switch circuit is implemented in region A and a second switch circuit is implemented in region C.

FIG. 8 is a diagram illustrating an embodiment in which a first switch circuit is implemented in region A and a second switch circuit is implemented in region C. That is, FIG. 8 shows an embodiment in which at least some components of the voltage switching circuit 32 are implemented in the under slim region.

Referring to FIG. 8, the first switch circuit 412a may be formed in region A's 411, and the second switch circuit 412b may be formed at a position that is adjacent to bit line connector regions 441a to 441c and 443a to 443c among region C's 431 and 433. More specifically, first to third transistors TR1 to TR3 among first to sixth transistors TR1 to TR6, configuring the second switch circuit 412b, may be formed at the position that is adjacent to the bit line connector regions 441a to 441c, and the fourth to sixth transistors TR4 to TR6 may be formed at the position that is adjacent to the bit line connector regions 443a to 443c. The first to sixth transistors TR1 to TR6 may correspond to the seventeenth to twenty-second switches SW17 to SW22, shown in FIG. 7B, respectively.

Although only one second switch circuit 412b is shown in FIG. 8, as described above, the same number of second switch circuits as the number of global word lines GWLs may be required. As shown in FIG. 8, in the case in which the first switch circuit 412a is formed in region A 411 and the second switch circuit 412b is formed in the under slim region, that is, region C's 431 and 433 among the voltage switching circuits, the area that is required for region A's may be reduced. Accordingly, the area that is occupied by the semiconductor memory device 10 is reduced.

Figure 9:
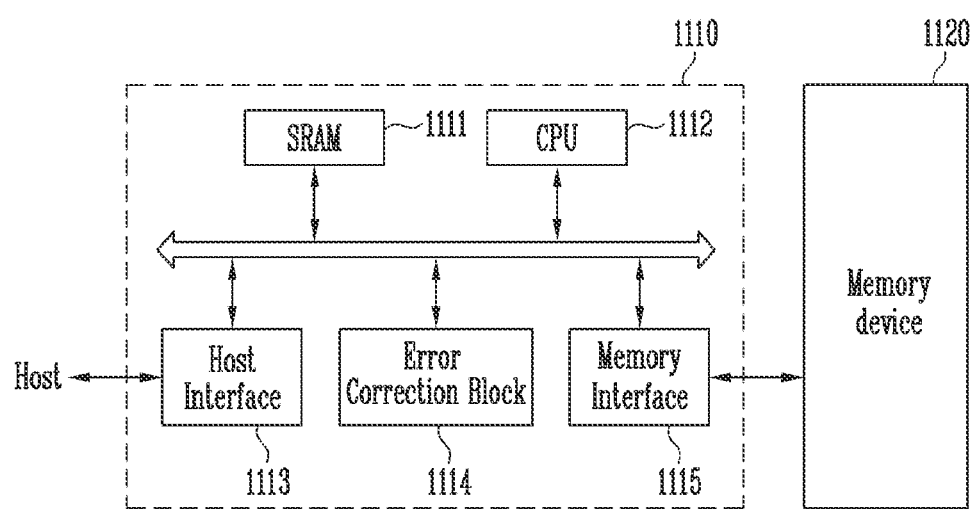
FIG. 9 is a block diagram illustrating a configuration of a memory system according to an embodiment.

FIG. 9 is a block diagram illustrating a configuration of a memory system according to an embodiment.

Referring to FIG. 9, the memory system 1100 includes a memory device 1120 and a memory controller 1110.

The memory device 1120 may be a multi-chip package that is configured of a plurality of flash memory chips. As an embodiment, the memory device 1120 may include a memory cell array, bit lines that are connected to the memory cell array, and a conductive layer that is positioned on the bit lines.

The memory controller 1110 may be configured to control the memory device 1120 and may include a static random access memory (SRAM) 1111, a CPU 1112, a host interface 1113, an error correction block 1114, and a memory interface 1115. The SRAM 1111 may be used as an operation memory of the CPU 1112, the CPU 1112 may perform an overall control operation for data exchange of the memory controller 1110, and the host interface 1113 may include a data exchange protocol of a host that is connected to the memory system 1100. The error correction block 1114 may detect and correct an error that is included in data read from the memory device 1120. The memory interface 1115 may perform interfacing with the memory device 1120. In addition, the memory controller 1110 may further include a read only memory (ROM) that stores code data for interfacing with the host.

The above-described memory system 1100 may be a memory card or a solid state disk (SSD) in which the memory device 1120 and the memory controller 1110 are combined. For example, when the memory system 1100 is the SSD, the memory controller 1110 may communicate with the outside (for example, the host) through one of various interface protocols such as a universal serial bus (USB), a multimedia card (MMC), a peripheral component interconnection-express (PCI-E), a serial advanced technology attachment (SATA), a parallel advanced technology attachment (PATA), a small computer system interface (SCSI), an enhanced small disk interface (ESDI), and integrated drive electronics (IDE), FIG. 10 is a block diagram illustrating a configuration of a computing system according to an embodiment.

Figure 10:
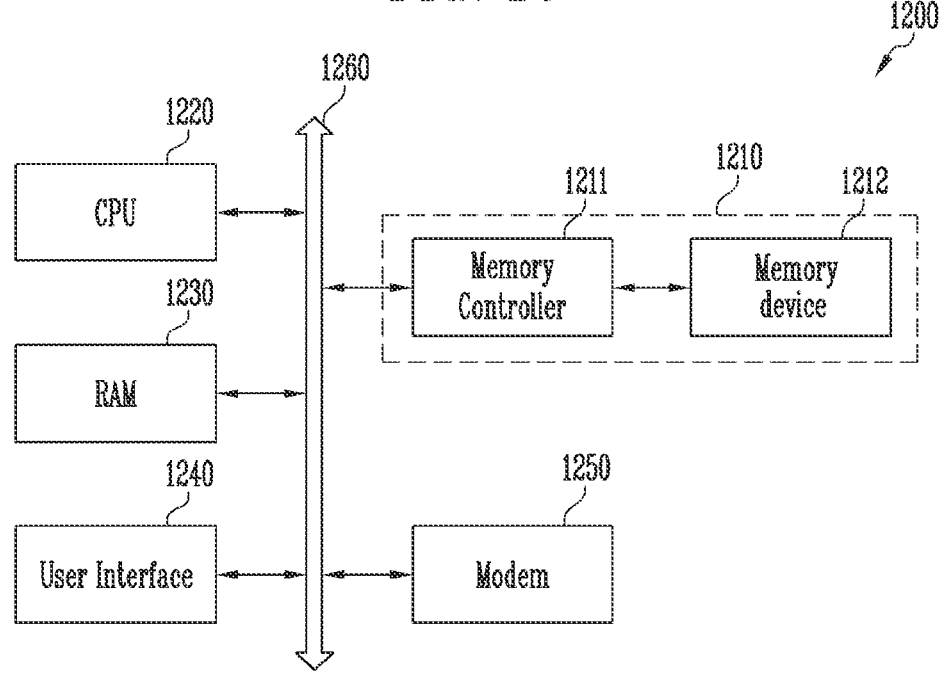
FIG. 10 is a block diagram illustrating a configuration of a computing system according to an embodiment.

Referring to FIG. 10, the computing system 1200 may include a CPU 1220, a random access memory (RAM) 1230, a user interface 1240, a modem 1250, and a memory system 1210 electrically that is connected to a system bus 1260. When the computing system 1200 is a mobile device, a battery for supplying an operation voltage to the computing system 1200 may be further included, and an application chipset, a camera image processor, a mobile DRAM, and the like may be further included.

The memory system 1210 may include a memory device 1212 and a memory controller 1211.

What is claimed is:

1. A semiconductor memory device comprising:
a memory cell array including a plurality of memory cells;
a row decoder connected to the memory cell array through word lines;
a plurality of page buffers connected to the memory cell array through bit lines; and
a voltage switching circuit configured to decode an operation voltage and transmit the decoded operation voltage to the row decoder,
wherein the plurality of page buffers are formed in a first under cell region among first and second under cell regions, the first and second under cell regions being adjacent to each other in a first direction under the memory cell array,
wherein at least a portion of the voltage switching circuit is formed in an under slim region that is adjacent to the first under cell region and the second under cell region in a second direction,
wherein the voltage switching circuit includes a first switch circuit and a second switch circuit, and
wherein the first switch circuit is formed in the second under cell region, and the second switch circuit is formed in the under slim region.

2. The semiconductor memory device of claim 1, wherein the first direction and the second direction form substantially a right angle.

3. The semiconductor memory device of claim 1, wherein the row decoder is formed on the under slim region.

4. The semiconductor memory device of claim 1, wherein the first under cell region includes at least one bit line connector region that extends in the second direction, and
wherein switches that are included in the second switch circuit are formed to be adjacent to the bit line connector region in the second direction in the under slim region.

5. The semiconductor memory device of claim 4, wherein the first switch circuit includes a first circuit block, a second circuit block, a third circuit block, and a fourth circuit block,
wherein the first circuit block switches a plurality of voltages and transmits a switched voltage to the second circuit block,
wherein the second circuit block selectively outputs the voltage that is received from the first circuit block to any one of a first output terminal and a second output terminal, wherein the third circuit block selectively outputs any one of an internal low voltage, an external power voltage, a core voltage, and a ground voltage to the first output terminal, and wherein the fourth circuit block selects any one of the internal low voltage, the external power voltage, the core voltage, and the ground voltage and outputs the selected one to the second output terminal.

6. The semiconductor memory device of claim 5, wherein the first circuit block comprises:
a first switch selectively transmitting a first pass voltage to the second circuit block;
a second switch selectively transmitting a second pass voltage to the second circuit block;
a third switch selectively transmitting a third pass voltage to the second circuit block; and
a fourth switch transmitting an initialization voltage to the second circuit block.

7. The semiconductor memory device of claim 6, wherein the second circuit block comprises:
a fifth switch selectively transmitting the voltage that is received from the first circuit block to the first output terminal; and
a sixth switch selectively transmitting the voltage that is received from the first circuit block to the second output terminal.

8. The semiconductor memory device of claim 7, wherein the third circuit block comprises:
a seventh switch connected to the first output terminal;
an eighth switch selectively transmitting the internal low voltage to the seventh switch;
a ninth switch selectively transmitting the core voltage to the seventh switch;
a tenth switch selectively transmitting the external power voltage to the seventh switch; and
an eleventh switch selectively transmitting the ground voltage to the seventh switch.

9. The semiconductor memory device of claim 8, wherein the fourth circuit block comprises:
a twelfth switch connected to the second output terminal;
a thirteenth switch selectively transmitting the internal low voltage to the twelfth switch;
a fourteenth switch selectively transmitting the core voltage to the twelfth switch;
a fifteenth switch selectively transmitting the external power voltage to the twelfth switch; and
a sixteenth switch selectively transmitting the ground voltage to the twelfth switch.

10. The semiconductor memory device of claim 5, wherein the second switch circuit comprises:
a seventeenth switch selectively transmitting the voltage that is received from the first output terminal to a third output terminal;
an eighteenth switch selectively transmitting a select global word line voltage to the third output terminal; and
a nineteenth switch transmitting an internal power voltage to the third output terminal.

11. The semiconductor memory device of claim 10, wherein the second switch circuit further comprises:
a twentieth switch selectively transmitting the voltage that is received from the second output terminal to a fourth output terminal;
a twenty-first switch selectively transmitting the select global word line voltage to the fourth output terminal; and
a twenty-second switch transmitting the internal power voltage to the fourth output terminal.

12. The semiconductor memory device of claim 1, further comprising:
a voltage generator configured to generate the operation voltage and transmit the generated operation voltage to the voltage switching circuit.

* * * * *